US011500023B2

(12) United States Patent
Kazuno et al.

(10) Patent No.: US 11,500,023 B2
(45) Date of Patent: Nov. 15, 2022

(54) BATTERY STATE DETERMINATION SYSTEM AND BATTERY STATE DETERMINATION METHOD

(71) Applicant: HONDA MOTOR CO., LTD., Tokyo (JP)

(72) Inventors: Shuichi Kazuno, Wako (JP); Takuma Kawahara, Wako (JP); Tsubasa Uchida, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 79 days.

(21) Appl. No.: 16/950,934

(22) Filed: Nov. 18, 2020

(65) Prior Publication Data

US 2021/0156921 A1 May 27, 2021

(30) Foreign Application Priority Data

Nov. 25, 2019 (JP) .............................. JP2019-212219

(51) Int. Cl.
*G01R 31/367* (2019.01)
*H01M 10/42* (2006.01)

(52) U.S. Cl.
CPC ........ *G01R 31/367* (2019.01); *H01M 10/425* (2013.01); *H01M 2010/4278* (2013.01)

(58) Field of Classification Search
None
See application file for complete search history.

(56) References Cited

U.S. PATENT DOCUMENTS

2018/0006335 A1* 1/2018 Fujita .................... H02J 7/0045
2018/0222343 A1* 8/2018 Uchida .............. G06Q 30/0601

FOREIGN PATENT DOCUMENTS

| CN | 110416636 | 11/2019 |
|----|-----------|---------|
| JP | 2013-115863 | 6/2013 |
| JP | 2014-163680 | 9/2014 |
| JP | 2018-029430 | 2/2018 |
| JP | 2018-046711 | 3/2018 |
| JP | 2018-129269 | 8/2018 |

(Continued)

OTHER PUBLICATIONS

Japanese Notice of Allowance for Japanese Patent Application No. 2019-212219 dated Aug. 24, 2021.

*Primary Examiner* — Roy Y Yi
(74) *Attorney, Agent, or Firm* — Amin, Turocy & Watson, LLP

(57) ABSTRACT

A battery state determination system is a battery state determination system including an in-vehicle device and a server device, the in-vehicle device includes an acquisition part acquires physical quantity data showing a physical quantity related to a state of a battery mounted in a vehicle, an observation part that observes a feature related to a state change of the battery on the basis of the physical quantity data at a plurality of different observation times, and a transmission part that transmits a plurality of pieces of feature data which expresses the feature observed each observation time to the server device, and the server device includes a reception part that receives the plurality of pieces of feature data transmitted from the in-vehicle device, and a diagnosis part that diagnoses a deterioration state of the battery on the basis of the plurality of pieces of feature data.

3 Claims, 4 Drawing Sheets

(56) References Cited

FOREIGN PATENT DOCUMENTS

| JP | 2018-148650 | 9/2018 |
| JP | 2019-175544 | 10/2019 |
| WO | 2011/135804 | 11/2011 |

* cited by examiner

BATTERY STATE DETERMINATION SYSTEM AND BATTERY STATE DETERMINATION METHOD

CROSS-REFERENCE TO RELATED APPLICATION

Priority is claimed on Japanese Patent Application No. 2019-212219, filed Nov. 25, 2019, the content of which is incorporated herein by reference.

BACKGROUND OF THE INVENTION

Field of the Invention

The present invention relates to a battery state determination system and a battery state determination method.

Description of Related Art

In recent years, development of a vehicle that travels using an electric motor driven by electric power supplied from at least a battery (a secondary battery), for example, an electric vehicle (EV: an electric automobile), a hybrid electric vehicle (HEV: a hybrid electric automobile), or the like has been in progress. In such a vehicle, it is important to always be aware of a deterioration state of the battery.

In the related art, a technology for determining a deterioration state of a battery mounted in a vehicle is disclosed (for example, see Japanese Unexamined Patent Application, First Publication No. 2018-129269). However, like the technology in the related art, processing of determining the deterioration state in the vehicle or the battery itself is processing with a high operation load.

For this reason, in the related art, a technology of reducing an operation load to determine a deterioration state of a battery by sharing processing between a vehicle or a battery and an external server device is also disclosed (for example, see Japanese Unexamined Patent Application, First Publication No. 2013-115863).

SUMMARY OF THE INVENTION

In the related art of sharing processing between the vehicle or the battery and the external server device or the like, for example, a series of processing of detecting a value (a physical quantity) used in determination of a deterioration state of the battery such as a voltage value, a current value, or the like in the vehicle or the battery and transmitting the detected value to a server device, and determining the deterioration state of the battery on the basis of the physical quantity transmitted from the server device is performed. However, in general, a cycle in which the deterioration state of the battery is determined on the basis of the physical quantity transmitted to the server device is longer than a cycle in which the deterioration state of the battery is determined by detecting the physical quantity at the vehicle or the battery. For this reason, determination accuracy of the deterioration state of the battery by the server device may be lower than determination accuracy of the deterioration state of the battery at the vehicle or the battery itself.

An aspect of the present invention is directed to providing a battery state determination system and a battery state determination method that are capable of performing determination of a deterioration state of a battery mounted in a vehicle with high accuracy at a server device.

A battery state determination system and a battery state determination method according to the present invention employ the following configurations.

(1) A battery state determination system according to an aspect of the present invention includes an in-vehicle device and a server device, the in-vehicle device includes an acquisition part configured to acquire physical quantity data showing a physical quantity related to a state of a battery mounted in a vehicle, an observation part configured to observe a feature related to a state change of the battery on the basis of the physical quantity data at a plurality of different observation times, and a transmission part configured to transmit a plurality of pieces of feature data which expresses the feature observed for each observation time to the server device, and the server device includes a reception part configured to receive the plurality of pieces of feature data transmitted from the in-vehicle device and a diagnosis part configured to diagnose a deterioration state of the battery on the basis of the plurality of pieces of feature data.

(2) In the aspect of the above-mentioned (1), the diagnosis part may collect the received plurality of pieces of feature data for the each observation time, and diagnose the deterioration state with reference to the feature data observed at a predetermined observation time among of the collected plurality of pieces of feature data.

(3) In the aspect of the above-mentioned (2), the diagnosis part may diagnose the deterioration state with reference to the feature data observed at the observation time having the shortest period.

(4) In the aspect of any one of the above-mentioned (1) to (3), the feature data may be data expressing the state change of the battery by relying on a relationship between two different physical quantities which show the state of the battery.

(5) In the aspect of the above-mentioned (4), the feature data may be the data expressing the state change of the battery by relying on a relationship between a voltage value and a current value of the battery.

(6) In the aspect of the above-mentioned (4), the feature data may be the data expressing the state change of the battery by relying on a relationship between a voltage value and an electric power value of the battery.

(7) In the aspect of the above-mentioned (5) or (6), the feature data may include information showing a temperature of the battery during the observation time, and the diagnosis part may classify each of the plurality of pieces of feature data into a predetermined temperature range on the basis of the temperature included in the feature data and diagnoses the deterioration state for each of the temperature range.

(8) In addition, a battery state determination method according to an aspect of the present invention is a battery state determination method in a battery state determination system including an in-vehicle device and a server device, which is performed by a computer of the in-vehicle device, the method includes acquiring physical quantity data showing a physical quantity related to a state of a battery mounted in a vehicle, observing a feature related to a state change of the battery on the basis of the physical quantity data at a plurality of different observation times, and transmitting a plurality of pieces of feature data which expresses the feature observed for each observation time to the server device, and a computer of the server device receives the plurality of pieces of feature data transmitted from the in-vehicle device, and diagnoses a deterioration state of the battery on the basis of the plurality of pieces of feature data.

According to the aspects of the above-mentioned (1) to (8), determination of the deterioration state of the battery mounted in the vehicle can be performed more accurately at the server device.

DETAILED DESCRIPTION OF THE INVENTION

Hereinafter, embodiments of a battery state determination system and a battery state determination method of the present invention will be described with reference to the accompanying drawings. In the following description, an example of the case in which the battery state determination system of the present invention is employed in an electric automobile (EV) (hereinafter, simply referred to as "a vehicle") will be described.

[Configuration of Vehicle in which Battery State Determination System is Employed]

Figure 1:
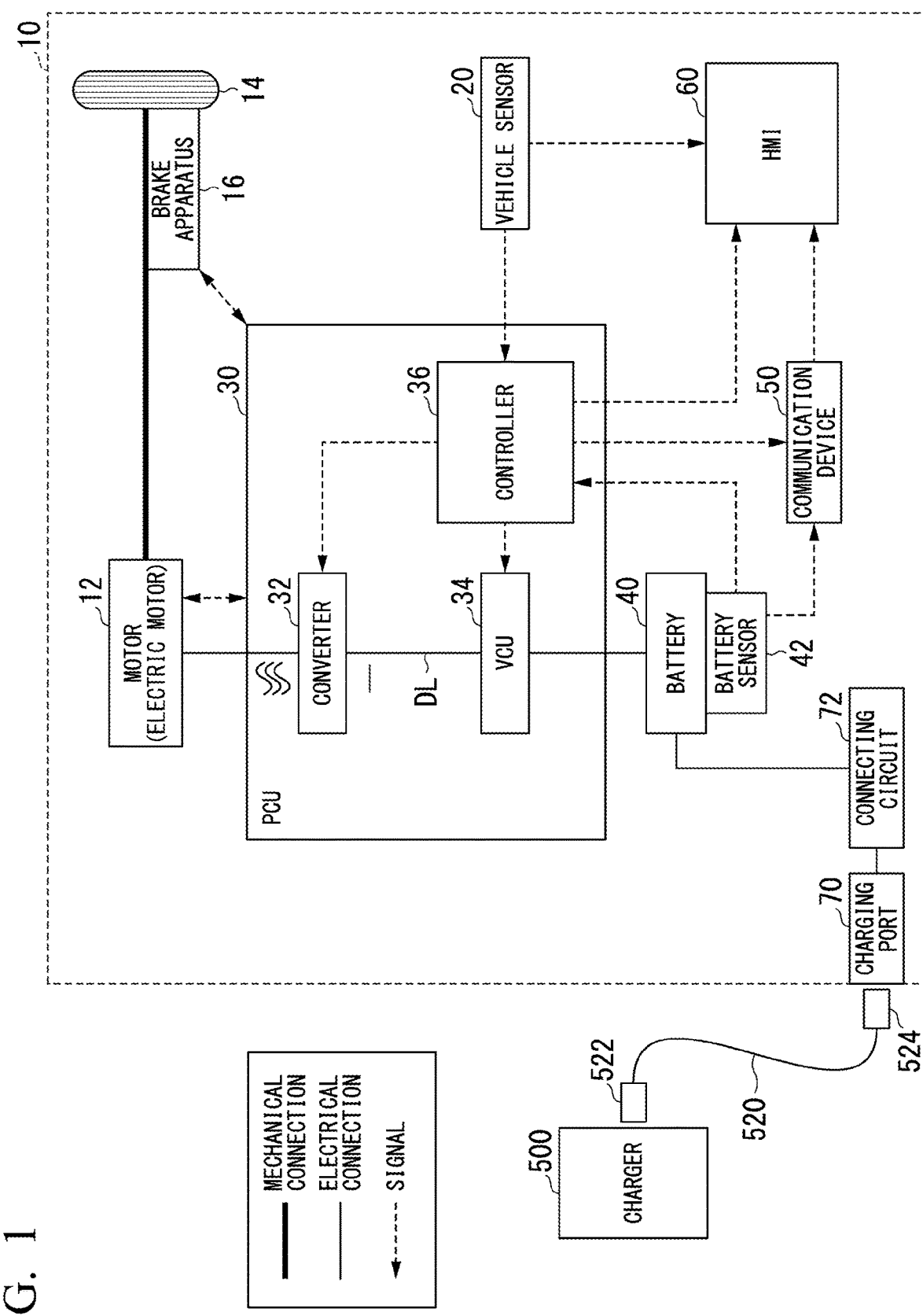
FIG. 1 is a view showing an example of a configuration of a vehicle in which a battery state determination system according to an embodiment is employed.

FIG. 1 is a view showing an example of a configuration of a vehicle 10 in which a battery state determination system 1 according to an embodiment is employed. The vehicle 10 shown in FIG. 1 is a battery electric vehicle (BEV: an electric automobile) that travels using a motor (an electric motor) driven by electric power supplied from a battery (a secondary battery) for traveling. Further, examples of the vehicle 10 include, in addition to a four-wheeled vehicle, for example, a saddle type two-wheeled vehicle, or a three-wheeled vehicle (including a two-front-wheeled and one-rear-wheeled vehicle in addition to a one-front-wheeled and two-rear-wheeled vehicle), and further, all vehicles that travel through an operation of an internal combustion engine or an electric motor driven by electric power supplied from a battery, for example, an assist type bicycle or the like.

The vehicle 10 shown in FIG. 1 includes, for example, a motor 12, a driving wheel 14, a brake apparatus 16, a vehicle sensor 20, a power control unit (PCU) 30, a battery 40, a battery sensor 42 such as a voltage sensor, a current sensor, a temperature sensor, and the like, a communication device 50, a human machine interface (HMI) 60 including a display device, a charging port 70, and a connecting circuit 72.

The motor 12 is, for example, a 3-phase alternating current electric motor. A rotator (a rotor) of the motor 12 is connected to the driving wheel 14. The motor 12 is driven by electric power supplied from a power storage part (not shown) included in the battery 40, and a rotating force is transmitted to the driving wheel 14. In addition, the motor 12 generates power using kinetic energy of the vehicle 10 upon deceleration of the vehicle 10.

The brake apparatus 16 may include, for example, a brake caliper, a cylinder configured to transmit a hydraulic pressure to the brake caliper and an electric motor configured to generate a hydraulic pressure in the cylinder. The brake apparatus 16 may include a mechanism configured to transmit the hydraulic pressure generated by an operation by a user (a driver) of the vehicle 10 with respect to a brake pedal (not shown) to the cylinder via a master cylinder as a backup. Further, the brake apparatus 16 is not limited to the above-mentioned configuration, and may be an electronically controlled hydraulic brake apparatus configured to transmit a hydraulic pressure of a master cylinder to a cylinder.

The vehicle sensor 20 includes, for example, an accelerator position sensor, a vehicle speed sensor, and a brake depression amount sensor. The accelerator position sensor is attached to an accelerator pedal, detects an amount of operation of the accelerator pedal by a driver, and outputs the detected operation amount to a controller 36 included in the PCU 30, which will be described below, as an accelerator position. The vehicle speed sensor includes, for example, wheel speed sensors attached to wheels of the vehicle 10 and a speed calculator, derives a speed of the vehicle 10 (a vehicle speed) by combining the wheel speeds detected by the wheel speed sensors, and outputs the derived speed to the controller 36 and the HMI 60. The brake depression amount sensor is attached to the brake pedal, detects an amount of operation of the brake pedal by the driver, and outputs the detected operation amount to the controller 36 as a brake depression amount.

The PCU 30 includes, for example, a converter 32, a voltage control unit (VCU) 34, and the controller 36. Further, in FIG. 1, the configuration in which these components are grouped together as the PCU 30 is merely an example, and those components in the vehicle 10 may be arranged in a distributed manner.

The converter 32 is, for example, an AC-DC converter. A DC-side terminal of the converter 32 is connected to a DC link DL. The battery 40 is connected to the DC link DL via the VCU 34. The converter 32 converts alternating current generated by the motor 12 into direct current, and outputs the converted direct current to the DC link DL.

The VCU 34 is, for example, a DC-DC converter. The VCU 34 boosts electric power supplied from the battery 40, and outputs the boosted electric power to the DC link DL.

The controller 36 includes, for example, a motor controller, a brake controller, and a battery/VCU controller. The motor controller, the brake controller, and the battery/VCU controller may be replaced with separate control devices, for example, control devices referred to as a motor electronic control unit (ECU), a brake ECU, and a battery ECU.

In addition, the controller 36, or the motor controller included in the controller 36, the brake controller, and the battery/VCU controller are realized by executing a program (software) using a hardware processor such as a central processing unit (CPU) or the like. In addition, some or all of these components may be realized by hardware (a circuit part; including circuitry) such as a large scale integration (LSI), an application specific integrated circuit (ASIC), a field-programmable gate array (FPGA), a graphics processing unit (GPU), or the like, or may be realized by software and hardware in cooperation. In addition, some or all functions of these components may be realized by a dedicated LSI. The program may have been previously stored in a storage device such as a hard disk drive (HDD), a flash memory, or the like included in the vehicle 10 (a storage device including a non-transient recording medium), or may be stored in a detachable recording medium (a non-transient recording medium) such as a DVD, a CD-ROM, or the like and installed on an HDD or flash memory included in the vehicle 10 by a recording medium being mounted in a drive device included in the vehicle 10.

The motor controller of the controller 36 controls driving of the motor 12 on the basis of the output from the accelerator position sensor included in the vehicle sensor 20. The brake controller of the controller 36 controls the brake apparatus 16 on the basis of the output from the brake pedaling sensor included in the vehicle sensor 20. The battery/VCU controller of the controller 36 calculates, for example, a state of charge (SOC; hereinafter referred to as "a battery charging rate") of the battery 40 on the basis of the output from the battery sensor 42, which will be described below, connected to the battery 40, and outputs the SOC to the VCU 34, and the HMI 60. The controller 36 may output information of the vehicle speed output from the vehicle sensor 20 to the HMI 60. The VCU 34 increases a voltage of the DC link DL according to an instruction from the battery/VCU controller.

The battery 40 is a secondary battery capable of repeating charging and discharge, for example, a lithium ion battery or the like. As the secondary battery that constitutes the battery 40, in addition to a lead storage battery, a nickel hydride battery, a sodium ion battery, or the like, for example, a capacitor such as an electric dual layer capacitor or the like, a compound battery obtained by combining a secondary battery and capacitor, or the like are also conceivable. Further, in the present invention, the configuration of the secondary battery in the battery 40 is not particularly defined. In addition, the battery 40 may be, for example, a cassette type battery pack or the like detachably mounted in the vehicle 10. The battery 40 stores electric power introduced from a charger 500 outside the vehicle 10, and performs discharge for traveling of the vehicle 10.

The battery sensor 42 detects a physical quantity such as a current, a voltage, a temperature, or the like of the battery 40. The battery sensor 42 includes, for example, a current sensor, a voltage sensor, and a temperature sensor. The battery sensor 42 detects the current of the secondary battery (hereinafter, simply referred to as "the battery 40") that constitutes the battery 40 using the current sensor, detects the voltage of the battery 40 using the voltage sensor, and detects the temperature of the battery 40 using the temperature sensor. The battery sensor 42 outputs data of an physical quantity (hereinafter, referred to as "physical quantity data") such as the current value, the voltage value, the temperature, and the like of the battery 40, which are detected, to the controller 36 or the communication device 50. The battery sensor 42 is an example of "the acquisition part" in the claims.

The controller 36 observes physical quantity data such as a current value, a voltage value, a temperature, or the like, of the battery 40 detected and output by the battery sensor 42, and calculates features related to a change in state of the battery 40 used to determine (diagnose) a deterioration state of the battery 40. For example, the controller 36 observes the current value and the voltage value output from the battery sensor 42 at a predetermined observation time, and calculates an I-V feature expressing a change in state of the battery 40. In addition, for example, the controller 36 may calculate a P-V feature expressing a change in state of the battery 40 by relying on a relationship between the electric power value and the voltage value on the basis of the current value and the voltage value observed at the predetermined observation time. A plurality of times (periods) are set as the predetermined observation time. The predetermined observation time is a period of, for example, 5 seconds, 10 seconds, 15 seconds, or the like. The respective periods are set as separate observation times when the battery 40 is in a discharging state and when the battery 40 is being charged. When the period in which the state of the battery 40 is continuously the same state corresponds to any one of "the predetermined observation times," the physical quantity data observed in the period is employed as observation data in the observation time. For example, the physical quantity data observed in the period in which the battery 40 is continuously discharged for 5 seconds is employed as observation data of discharging time=5 seconds. In addition, for example, the physical quantity data observed in the period in which the battery 40 is continuously discharged for 10 seconds is employed as observation data of discharging time=10 seconds. When the corresponding predetermined observation times are plural, the same physical quantity data may be duplicated as observation data for different observation times. For example, in the physical quantity data observed in the period in which the battery 40 is continuously discharged for 10 seconds, the physical quantity data in the continuous 5 seconds may be employed as observation data of both of the observation data of discharging time=5 seconds and observation data of discharging time=10 seconds.

The controller 36 outputs data expressing features (hereinafter referred to as "feature data") related to the change in state of the battery 40 calculated on the basis of the physical quantity data observed at the predetermined observation time (observation data) to the communication device 50. The controller 36 is an example of "the observation part" in the claims.

The communication device 50 includes a wireless module configured to connect to a cellular network or a Wi-Fi network. The communication device 50 may include a wireless module configured to use Bluetooth (a registered trademark) or the like. The communication device 50 transmits and receives various types of information related to the vehicle 10 to/from the server device, which will be described below, on the network (not shown) that manages traveling of the vehicle 10 or a state of the battery 40 through communication in the wireless module. The communication device 50 transmits the feature data of the battery 40 output from the controller 36 to the server device, which will be described below. The communication device 50 may receive information expressing the deterioration state of the battery 40 diagnosed and transmitted from the server device, which will be described below, and output the received information expressing the deterioration state of the battery 40 to the HMI 60. The communication device 50 is an example of "the transmission part" in the claims.

The HMI 60 provides various types of information to a user of the vehicle 10, for example, a driver or the like, and receives an input operation of the user. The HMI 60 is, for example, a so-called touch panel in which a display device such as a liquid crystal display (LCD) or the like and an input device configured to detect an input operation are combined. The HMI 60 may include various types of display parts other than the display device, a speaker, a buzzer, and switches other than the input device, a key, and the like. The HMI 60 may share the display device or the input device with a display device or an input device of such as, for example, an in-vehicle navigation device or the like.

The charging port 70 is a mechanism configured to charge the battery 40 (the secondary battery). The charging port 70 is oriented toward the outside from the vehicle body of the vehicle 10. The charging port 70 is connected to the charger 500 via a charging cable 520. The charging cable 520 includes a first plug 522 and a second plug 524. The first plug 522 is connected to the charger 500, and the second plug 524 is connected to the charging port 70. Electricity supplied from the charger 500 is input (supplied) to the charging port 70 via the charging cable 520, respectively.

In addition, the charging cable 520 includes a signal cable attached to the electric power cable. The signal cable mediates communication between the vehicle 10 and the charger 500. Accordingly, an electric power connector configured to connect the electric power cable and a signal connector configured to connect the signal cable are provided on the first plug 522 and the second plug 524.

The connecting circuit 72 is provided between the charging port 70 and the battery 40. The connecting circuit 72 transmits current introduced from the charger 500 via the charging port 70, for example, direct current as current that is supplied to the battery 40. The connecting circuit 72 outputs, for example, the direct current to the battery 40, and stores (charges) electric power in the battery 40 (the secondary battery).

[Configuration of Battery State Determination System]

Figure 2:
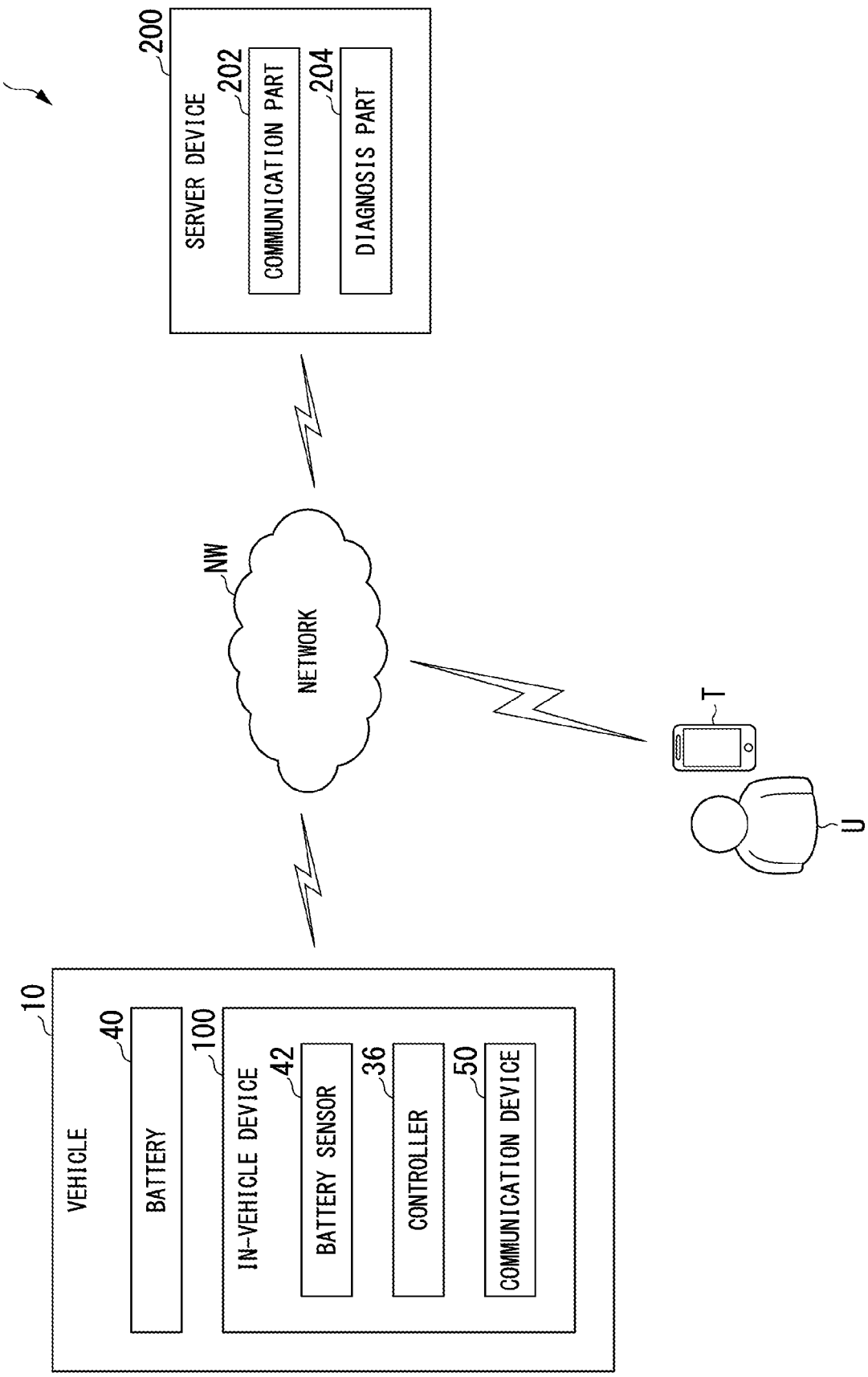
FIG. 2 is a view showing an example of a configuration of the battery state determination system according to the embodiment.

Next, an example of the battery state determination system including the vehicle 10 in which the battery 40 is mounted will be described. FIG. 2 is a view showing an example of a configuration of the battery state determination system 1 according to the embodiment. The battery state determination system 1 shown in FIG. 2 includes, for example, an in-vehicle device 100 included in the vehicle 10 in which the battery 40 is mounted, and a server device 200.

The communication device 50 and the server device 200 communicate with each other via a network NW. The network NW is a communication network for wireless communication including, for example, the Internet, a wide area network (WAN), a local area network (LAN), a provider device, a radio base station, or the like. Further, in FIG. 2, a user terminal T is shown as being connected to the network NW. In this case, for example, the server device 200 can communicate with the user terminal T via the network NW.

The battery state determination system 1 is a system configured to diagnose a deterioration state of the battery 40 included in the vehicle 10. In the battery state determination system 1, the in-vehicle device 100 included in the vehicle 10 transmits feature data of each feature (for example an I-V feature) related to the calculated change in state of the battery 40 to the server device 200 via the network NW. Then, in the battery state determination system 1, the server device 200 diagnoses a deterioration state of the battery 40 included in the vehicle 10 on the basis of the feature data transmitted from the in-vehicle device 100. In the battery state determination system 1, the server device 200 transmits information of the result obtained by diagnosing the deterioration state of the battery 40 (the diagnostic result) to the vehicle 10 via the network NW. Accordingly, for example, the HMI 60 included in the vehicle 10 displays the information of the diagnostic result transmitted from the server device 200 on, for example, the display device, and provides the information to a user of the vehicle 10. In addition, in the battery state determination system 1, the server device 200 may transmit the information of the diagnostic result of the deterioration state of the battery 40 to the user terminal T via the network NW. Accordingly, the user terminal T may notify, for example, a user of the vehicle 10 of the information of the diagnostic result transmitted from the server device 200.

Further, the battery state determination system 1 may perform learning of the deterioration state of the battery 40 on the basis of the result obtained by diagnosing the deterioration state of the battery 40 using the server device 200. Accordingly, in the battery state determination system 1, the server device 200 can more appropriately manage the deterioration state of the battery 40 included in the vehicle 10.

The in-vehicle device 100 includes, for example, the battery sensor 42, the controller 36 and the communication device 50. The battery sensor 42 detects a current value, a voltage value and a temperature of the battery 40 at, for example, 10 millisecond intervals. The battery sensor 42 outputs the detected physical quantity data such as the current value, the voltage value, the temperature, or the like, of the battery 40 to the controller 36.

The controller 36 observes physical quantity data such as a current value, a voltage value, a temperature, or the like of the battery 40 output from the battery sensor 42 for every observation time, and generates feature data expressing the state of the battery 40 on the basis of the observed physical quantity data. The feature data is, for example, data expressing the I-V feature or the P-V feature of the battery 40 used to diagnose the deterioration state of the battery 40. The controller 36 generates, for example, feature data for each observation time when a discharging time is 5 seconds, 10 seconds, or 15 seconds, or feature data for each observation time when a charging time is 5 seconds, 10 seconds, or 15 seconds. For this reason, the controller 36 clocks, for example, a period of each observation time using a timer function, and generates each piece of feature data on the basis of the physical quantity data observed during the period of the clocked observation time. For example, when the feature data expressing the I-V feature is generated for the observation time of discharging time=5 seconds, the controller 36 clocks 5 seconds when the battery 40 is continuously discharged, and generates feature data showing the I-V feature on the basis of the voltage value corresponding to each current value obtained by observing the physical quantity data of the battery 40 detected and output by the battery sensor 42 during the clocked period at, for example, 10 millisecond intervals. Similarly, the controller 36 generates feature data for the observation times of discharging time=10 seconds and discharging time=15 seconds, or feature data showing the I-V feature for the observation times of charging time=5 seconds, charging time=10 seconds, and charging time=15 seconds.

The feature data showing the I-V feature is, for example, data expressing an inclination of a line segment expressing a function obtained by expressing (plotting) the current value obtained through observation and the corresponding voltage value on the graph of the I-V feature. The inclination of the line segment expresses an internal resistance of the battery 40. Accordingly, it can be said that the feature data showing the I-V feature is one resistance value expressing the internal resistance of the battery 40 obtained for each observation time. Further, the controller 36 may use the physical quantity data of the current value and the voltage value observed at the beginning of the observation time and the current value and the voltage value observed at the end of the observation time as the feature data expressing the I-V feature. That is, the controller 36 may use a set of two current values and two voltage values (four physical quantity data) at the beginning and ending of the observation time as one piece of feature data expressing the I-V feature.

The controller 36 outputs the feature data for each generated observation time to the communication device 50 together with information of the observation time and information of whether the battery 40 is being charged or being discharged. In addition, the feature data may include information showing a temperature variation of the battery 40 during the period of the observation time or the SOC (the battery charging rate) information of the battery 40.

The communication device 50 transmits the feature data of the battery 40 for each observation time output from the controller 36 to the server device 200 through communication via the network NW.

The user terminal T is, for example, a terminal device such as a smart phone, a tablet terminal, or the like, carried by a user of the user terminal T (hereinafter referred to as "a user U") such as a driver or the like of the vehicle 10. The user terminal T may be, for example, a stationary type terminal device used by the user U. In the user terminal T, an application configured to receive identification or notification of the deterioration state of the battery 40 (hereinafter referred to as "a battery identification application") or the like is executed. The user terminal T provides the received information of the diagnostic result to the user U by, for example, displaying the information on the display device when the information of the diagnostic result transmitted from the server device 200 is received. The user U can require identification of the current deterioration state of the battery 40 with respect to the server device 200 at an arbitrary timing by operating the battery identification application executed by the user terminal T. In this case, the user terminal T transmits the identification requirement that requires transmission of the deterioration state of the battery 40 to the server device 200 via the network NW.

The server device 200 manages the deterioration state of the battery 40 included in the vehicle 10. The server device 200 includes, for example, a communication part 202 and a diagnosis part 204. The communication part 202 and the diagnosis part 204 are realized by executing a program (software) using a hardware processor such as a CPU or the like. In addition, some or all of these components may be realized by hardware (a circuit part; including circuitry) such as an LSI, an ASIC, an FPGA, a GPU, or the like, or may be realized by software and hardware in cooperation. In addition, some or all functions of these components may be realized by a dedicated LSI. The program may be previously stored in a storage device such as an HDD, a flash memory, or the like, included in the server device 200 (a storage device including a non-transient recording medium), may be stored in a detachable recording medium (a non-transient recording medium) such as a DVD, a CD-ROM, or the like, or may be installed on an HDD or a flash memory included in the server device 200 by mounting the recording medium in the drive device included in the server device 200.

The communication part 202 performs communication with the communication device 50 included in the vehicle 10 or the user terminal T via the network NW and exchanges the information. The communication part 202 receives each piece of feature data of the battery 40 transmitted from the in-vehicle device 100 included in the vehicle 10 through communication via the network NW. The communication part 202 outputs the received feature data of the battery 40 to the diagnosis part 204. The communication part 202 outputs the received identification requirement of the battery 40 to the diagnosis part 204 when the identification requirement of the battery 40 is received from the user terminal T through communication via the network NW. The communication part 202 is an example of "the reception part" in the claims.

The diagnosis part 204 diagnoses the deterioration state of the battery 40 on the basis of the feature data of the battery 40 output from the communication part 202. More specifically, the diagnosis part 204 collects the feature data of the battery 40 output from the communication part 202 separately for each observation time included in the feature data. Then, the diagnosis part 204 diagnoses the deterioration state of the battery 40 with reference to a feature data group in which a plurality of pieces of collected feature data for a predetermined observation time are included. For example, when the feature data expressing the I-V feature is transmitted by the in-vehicle device 100, the diagnosis part 204 diagnoses the deterioration state of the battery 40 with reference to an I-V feature group in which feature data expressing the plurality of I-V features for a predetermined observation time is included. The predetermined observation time used by the diagnosis part 204 as a reference when the deterioration state of the battery 40 is diagnosed is, for example, the I-V feature group when the observation time is the shortest, 5 seconds, which can be collected most frequently. The diagnosis part 204 uses the I-V feature group of the observation time other than the reference observation time for assistance when the deterioration state of the battery 40 is diagnosed. For example, when the I-V feature group for the observation time of 5 seconds is used as a reference, the diagnosis part 204 uses the I-V feature group for the observation time of 10 seconds or 15 seconds to correct the diagnostic result by diagnosing the deterioration state of the battery 40. The diagnosis part 204 is an example of "the diagnosis part" in the claims.

Figure 3:
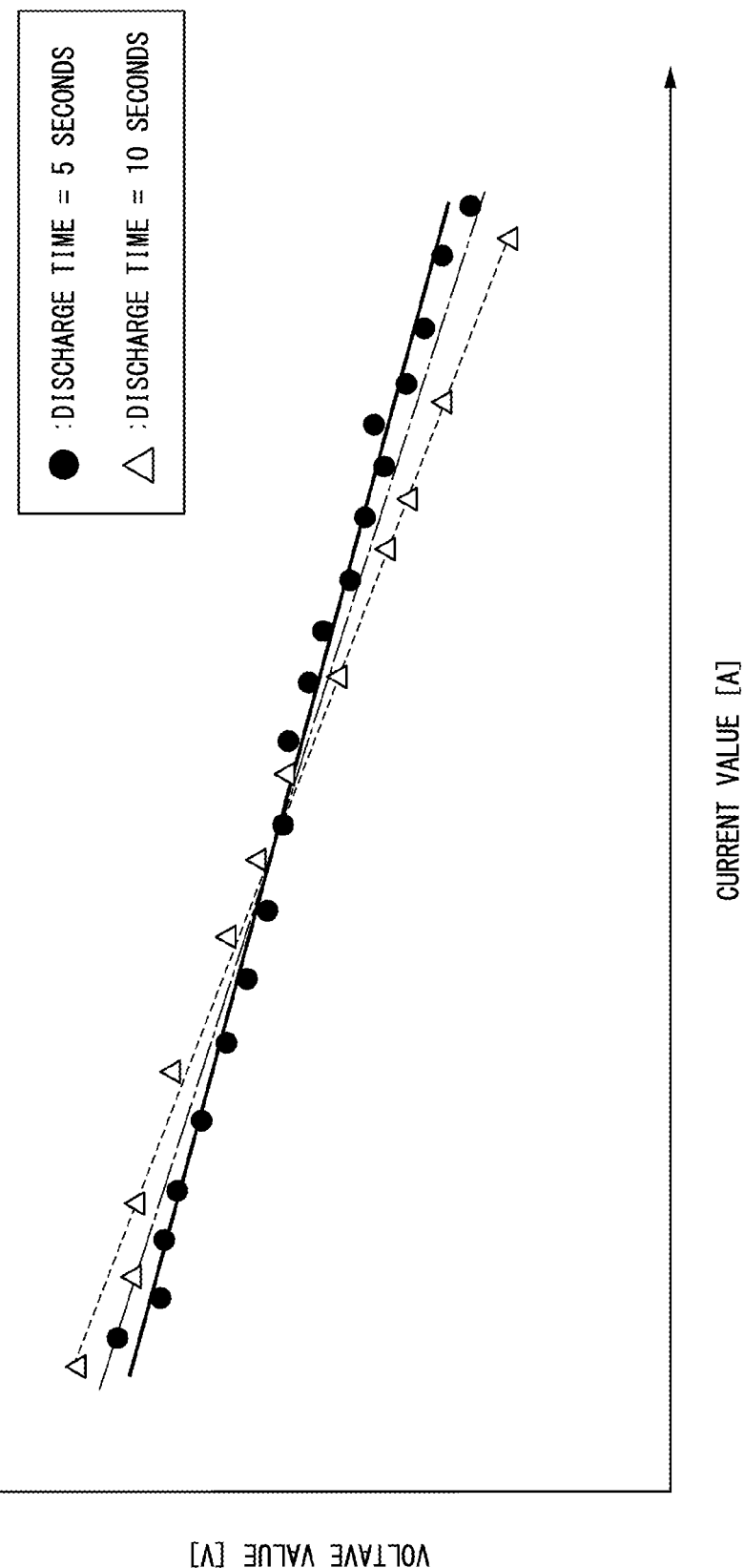
FIG. 3 is a view for describing an example of diagnostic processing of a deterioration state of a battery at a server device.

Here, an example of diagnosis of the deterioration state of the battery 40 in the diagnosis part 204 will be described. FIG. 3 is a view for describing an example of diagnostic processing of the deterioration state of the battery 40 in the server device 200 (more specifically, the diagnosis part 204). FIG. 3 shows an example of an I-V feature of the battery 40 in which feature data expressing the I-V feature when a discharging time is 5 seconds and feature data expressing the I-V feature when a discharging time is 10 seconds, which are transmitted from the in-vehicle device 100, are expressed (plotted) on a graph in which a lateral axis is a current value and a vertical axis is a voltage value. Further, the graph shown in FIG. 3 is an example of the I-V feature when the SOC (the battery charging rate) of the battery 40 is constant (for example, SOC=50%).

As described above, the diagnosis part 204 collects the feature data expressing the I-V feature of the battery 40 transmitted from the in-vehicle device 100 and output from the communication part 202 separately for each observation time. In FIG. 3, the diagnosis part 204 separates the feature data expressing the I-V feature when the discharging time is 5 seconds and the feature data expressing the I-V feature when the discharging time is 10 seconds, and collects each as an I-V feature group.

The diagnosis part 204 diagnoses the deterioration state of the battery 40 with reference to the I-V feature group when the discharging time is 5 seconds in which the features can be collected at the highest frequency. Here, the feature of the battery 40, in which when the discharging time is 5 seconds, having an inclination shown by a solid line in FIG. 3 is obtained. In addition, in the diagnosis part 204, the feature of the battery 40, in which when the discharging time is 10 seconds, having an inclination as shown by a broken line in FIG. 3 is obtained from the I-V feature group in which when the discharging time is 10 seconds. The diagnosis part 204 diagnoses the deterioration state of the battery 40 on the basis of the feature of the battery 40 when the discharging time is 5 seconds. Here, the diagnosis part 204 corrects the diagnostic result of the deterioration state of the battery 40 using the feature of the battery 40 when the discharging time is 10 seconds for assistance, and obtains a final diagnostic result.

In this way, in the diagnosis part 204, the feature data expressing the I-V feature of the battery 40 transmitted from the in-vehicle device 100 is collected separately for each observation time, and the diagnostic result is corrected by an I-V feature group in another discharging time (in FIG. 3, 10 seconds) with reference to the I-V feature group when the discharging time is 5 seconds, which is shortest. Accordingly, the diagnosis part 204 can diagnose the deterioration state of the battery 40 with higher accuracy since the variations of the feature data expressing the I-V feature for each observation time can be suppressed with in the same observation time compared to the case in which the deterioration state is diagnosed using the feature data expressing the overall I-V features.

Further, when all of the feature data expressing the I-V feature are treated in the same way, accuracy of the diagnosis of the deterioration state of the battery 40 can be increased if it is possible to specify whether the variation in each of the feature data expressing the I-V feature is caused by deterioration of the battery 40 or by an error when the battery 40 is detected by the battery sensor 42 or when the feature data is generated. However, specifying such causes of variations is not an easy process. On the other hand, since the diagnosis part 204 collects the feature data expressing the I-V feature separately for each observation time and diagnoses the deterioration state of the battery 40 on the basis of the feature data with small variations, the deterioration state of the battery 40 can be accurately diagnosed without performing such specification of the causes of the variations. In FIG. 3, for reference, an example of the feature of the battery 40 obtained using the feature data expressing the entire I-V feature is shown by a dashed line. An inclination difference between the feature of the battery 40 when the discharging time is 5 seconds as shown by a solid line in FIG. 3 and the feature of the battery 40 obtained using the feature data expressing the entire I-V feature as shown by a dashed line in FIG. 3, is conceivable as an error in the diagnostic result of the deterioration state of the battery 40 that is diagnosed.

Moreover, each of the feature data expressing the I-V feature of the battery 40 transmitted from the in-vehicle device 100 is not the physical quantity data of the battery 40 detected by the battery sensor 42 at a short time interval, for example, a 10 millisecond interval or the like, rather it is the feature data generated by the controller 36 for each observation time. For this reason, in the battery state determination system 1, in a state in which a pressure on a communication band by information (data) in the network NW between the in-vehicle device 100 and the server device 200 is minimized, the deterioration state of the battery 40 can be diagnosed.

Further, as described above, the feature data of the battery 40 transmitted from the in-vehicle device 100 includes information of whether the battery 40 is being charged or being discharged, information showing a temperature variation of the battery 40 during a period of an observation time, information of an SOC (a battery charging rate) of the battery 40, or the like. For this reason, the diagnosis part 204 may collect the feature data expressing the I-V feature more precisely on the basis of the information included in each of the feature data when the feature data expressing the I-V feature of the battery 40 output from the communication part 202 is collected separately for each observation time. In this case, the diagnosis part 204 can perform diagnosis of the deterioration state of the battery 40 more accurately. For example, the diagnosis part 204 may collect each of the feature data expressing the I-V feature by classifying the each of the feature data expressing the I-V feature into ranges of a predetermined temperature variation on the basis of the information expressing the temperature variation of the battery 40 included in the feature data. In this case, the diagnosis part 204 can diagnose the deterioration state in consideration of the change in temperature of the battery 40, i.e., the deterioration state within a predetermined temperature range. In addition, for example, the diagnosis part 204 may collect the feature data expressing the I-V feature separately for each predetermined SOC on the basis of the information of the SOC (the battery charging rate) of the battery 40 included in the feature data. In this case, the diagnosis part 204 can diagnose the deterioration state in the predetermined SOC of the battery 40.

Returning to FIG. 2, the diagnosis part 204 outputs the information of the diagnostic result expressing the diagnosed deterioration state of the battery 40 to the communication part 202. Further, the diagnosis part 204 outputs to the communication part 202 the information of the diagnostic result expressing the deterioration state at the current point of time of the battery 40 diagnosed using the feature data collected until to the current point of time when the identification requirement from the user terminal T is output by the communication part 202.

The communication part 202 transmits the information of the diagnostic result output from the diagnosis part 204 to the in-vehicle device 100 included in the vehicle 10 or the user terminal T through communication via the network NW. Accordingly, the diagnostic result of the deterioration state of the battery 40 diagnosed by the diagnosis part 204 is displayed on, for example, the display device by the HMI 60 included in the vehicle 10. In addition, the diagnostic result of deterioration state of the battery 40 diagnosed by the diagnosis part 204 may be displayed on the display device of the user terminal T by the battery identification application, and provided to the user U.

[Flow of Entire Processing of Battery State Determination System]

Figure 4:
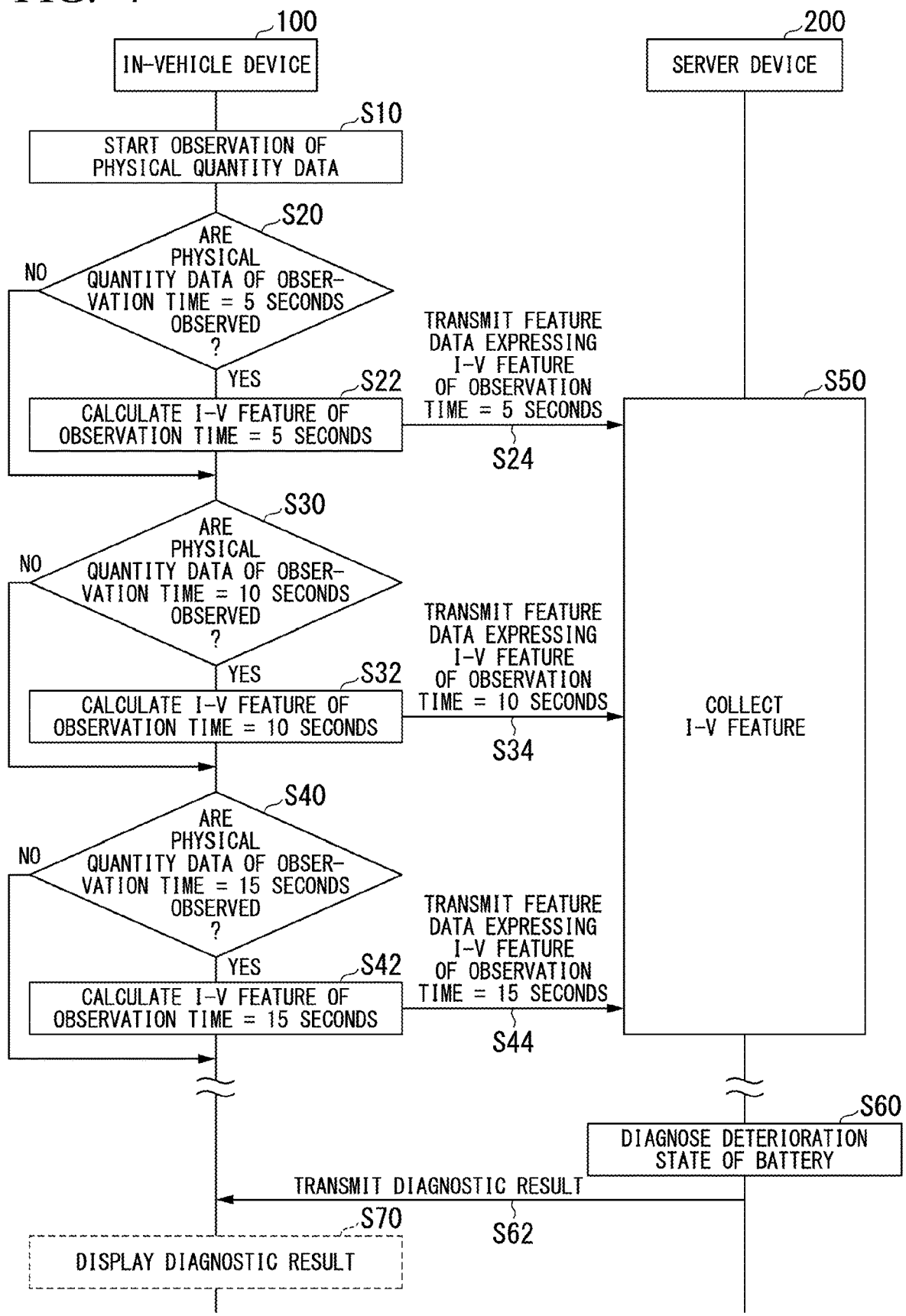
FIG. 4 is a sequential diagram showing an example of a flow of the entire processing in the battery state determination system.

Next, an example of the entire flow of the processing of diagnosing (determining) the deterioration state of the battery 40 in the battery state determination system 1 will be described. FIG. 4 is a sequential diagram showing an example of the entire flow of the processing in the battery state determination system 1. FIG. 4 shows an example of processing between the in-vehicle device 100 and the server device 200 associated with when the deterioration state of the battery 40 in the battery state determination system 1 is diagnosed. The processing of the sequential diagram is repeatedly executed during a period in which the battery 40 in the vehicle 10 is used. Further, while the in-vehicle device 100 and the server device 200 perform operations corresponding to the components shown in FIG. 2, respectively. However, in the following description, in order to make the description easier, it is provided that the in-vehicle device 100 and the server device 200 directly exchange the information for diagnosing the deterioration state of the battery 40 or the information of the diagnostic result. In addition, in the following description, the deterioration state of the battery 40 is diagnosed on the basis of the feature data expressing the I-V feature. Further, observation of the physical quantity data of the battery 40 in the in-vehicle device 100 is performed regardless of whether the battery 40 is being charged or being discharged. However, in the following description, in order to make the description easier, it is provided that the battery 40 starts observation of the physical quantity data when the battery becomes the discharged state.

In the example of the processing in the battery state determination system 1 shown in FIG. 4, first, when it becomes a state in which the use of the battery 40 in the vehicle 10 is started and the battery 40 is discharged, the in-vehicle device 100 starts observation of the physical quantity data of the battery 40 (step S10).

After that, the in-vehicle device 100 identifies whether physical quantity data of observation time (discharging time)=5 seconds are observed (step S20). That is, the in-vehicle device 100 identifies whether the physical quantity data in a state in which the battery 40 is continuously discharged are observed during discharging time=5 seconds. When it is identified that the physical quantity data of discharging time=5 seconds are observed in step S20, the in-vehicle device 100 calculates the I-V feature of observation time (discharging time)=5 seconds in the battery 40 on the basis of the observed physical quantity data (step S22). Then, the in-vehicle device 100 generates the feature data expressing I-V feature of the calculated observation time (discharging time)=5 seconds, and transmits the generated feature data to the server device 200 (step S24). Accordingly, the server device 200 collects the feature data transmitted from the in-vehicle device 100 as the I-V feature group of discharging time=5 seconds (step S50). In addition, the in-vehicle device 100 advances the processing to step S30.

Meanwhile, when it is identified that the physical quantity data of discharging time=5 seconds are not observed in step S20, the in-vehicle device 100 advances the processing to step S30. Further, it is conceivable that not observing the physical quantity data of discharging time=5 seconds in step S20 is, for example, the case in which the battery 40 has changed from the discharged state to the charged state during discharging time=5 seconds, or the like. In this case, the in-vehicle device 100 starts observation of the physical quantity data of observation time (charging time)=5 seconds in a state in which the battery 40 is charged.

Next, the in-vehicle device 100 identifies whether the physical quantity data of observation time (discharging time)=10 seconds are observed (step S30). That is, the in-vehicle device 100 identifies whether the physical quantity data in a state in which the battery 40 is continuously discharged are observed during 5 seconds continuously after discharging time=5 seconds, after the identification of step S20, or during 10 seconds started from a timing different from the timing of starting of discharging time=5 seconds. When it is identified that the physical quantity data of discharging time=10 seconds are observed in step S30, the in-vehicle device 100 calculates the I-V feature of observation time (discharging time)=10 seconds in the battery 40 on the basis of the observed physical quantity data (step S32). Then, the in-vehicle device 100 generates feature data expressing the I-V feature of the calculated observation time (discharging time)=10 seconds, and transmits the generated feature data to the server device 200 (step S34). Accordingly, the server device 200 collects the feature data transmitted from the in-vehicle device 100 in step S50 as the I-V feature group of discharging time=10 seconds. In addition, the in-vehicle device 100 advances the processing to step S40.

Meanwhile, when it is identified that physical quantity data of discharging time=10 seconds are not observed in step S30, the in-vehicle device 100 advances the processing to step S40. Further, it is conceivable that not observing the physical quantity data of discharging time=10 seconds in step S30 is, for example, the case in which the battery 40 has changed from a discharged state to a charged state during 5 seconds continuously after discharging time=5 seconds or during discharging time=10 seconds. In this case, the in-vehicle device 100 starts observation of the physical quantity data of observation time (charging time)=10 seconds in a state in which the battery 40 is charged.

Next, the in-vehicle device 100 identifies whether the physical quantity data of observation time (discharging time)=15 seconds are observed (step S40). That is, the in-vehicle device 100 identifies whether the physical quantity data in a state in which the battery 40 is continuously discharged are observed during 5 seconds continuously after discharging time=10 seconds, after identification of step S30, or during 15 seconds started from a timing different with the timing of starting of discharging time=5 seconds or discharging time=10 seconds. When it is identified that the physical quantity data of discharging time=15 seconds are observed in step S40, the in-vehicle device 100 calculates the I-V feature of observation time (discharging time)=15 seconds in the battery 40 on the basis of the observed physical quantity data (step S42). Then, the in-vehicle device 100 generates feature data expressing the I-V feature of the calculated observation time (discharging time)=15 seconds, and transmits the generated feature data to the server device 200 (step S44). Accordingly, the server device 200 collects the feature data transmitted from the in-vehicle device 100 in step S50 as the I-V feature group of discharging time=15 seconds. In addition, the in-vehicle device 100 continues observation of the physical quantity data in the next observation time (discharging time).

Meanwhile, when it is determined that the physical quantity data of discharging time=15 seconds are not observed in step S40, the in-vehicle device 100 continues observation of the physical quantity data in the next observation time (discharging time). Further, it is considered that not observing the physical quantity data of discharging time=15 seconds in step S40 is, for example, the case in which the battery 40 has changed from a discharged state to the charged state during 5 seconds continuously after discharging time=10 seconds or during discharging time=15 seconds. In this case, the in-vehicle device 100 starts observation of the physical quantity data of observation time (charging time)=15 seconds in a state in which the battery 40 is charged.

After that, the server device 200 diagnoses the deterioration state of the battery 40 on the basis of the I-V feature group including the feature data for each observation time collected in step S50 (step S60). Further, timing when the server device 200 starts diagnosis of the deterioration state of the battery 40 in step S60 is arbitrary timing. For example, the server device 200 may start diagnosis of the deterioration state of the battery 40 after collecting the reference feature data during the observation time (for example, feature data of discharging time=5 seconds) to an extent which is necessary to diagnose the deterioration state of the battery 40. In addition, for example, the server device 200 may start diagnosis of the deterioration state of the battery 40 after collecting the feature data in the observation time used to correct the diagnostic result of the diagnosed deterioration state of the battery 40 (for example, the feature data of discharging time=10 seconds or 15 seconds) to an extent which is necessary to correct the diagnostic result. In addition, for example, the server device 200 may start diagnosis of the deterioration state of the battery 40 when the identification requirement of the battery 40 transmitted from the user terminal T is received.

Then, the server device 200 transmits the information of the diagnostic result obtained by diagnosing the deterioration state of the battery 40 to the in-vehicle device 100 (step S62). Accordingly, the in-vehicle device 100 outputs the information of the diagnostic result obtained by diagnosing the deterioration state of the battery 40, which is transmitted from the server device 200, to, for example, the HMI 60 included in the vehicle 10, displays the information on the display device using the HMI 60, and provides the information to the user of the vehicle 10 (step S70).

According to the flow of the above-mentioned entire processing, in the battery state determination system 1, the in-vehicle device 100 included in the vehicle 10 in which the battery 40 is mounted and the server device 200 cooperate with each other to diagnose the deterioration state of the battery 40. Here, in the battery state determination system 1, a certain level of processing related to diagnosis of the deterioration state of the battery 40 is performed in the in-vehicle device 100 (processing of calculating the I-V feature for a predetermined observation time), and the feature data expressing the I-V feature used to diagnose the deterioration state of the battery 40 are generated and transmitted to the server device 200. Accordingly, in the battery state determination system 1, the server device 200 can manage the deterioration state of the battery 40 included in the vehicle 10 by diagnosing the deterioration state of the battery 40 more accurately while reducing a load of an operation in the in-vehicle device 100 compared to the case in which the in-vehicle device 100 diagnoses the deterioration state of the battery 40.

Moreover, in the battery state determination system 1, since the feature data expressing the I-V feature of each of the battery 40, which the in-vehicle device 100 transmits to the server device 200, are feature data generated in the in-vehicle device 100, for example, a data amount is reduced in comparison with the physical quantity data detected by the battery sensor 42. For this reason, in the battery state determination system 1, a pressure in a communication band by the information (data) in the network NW between the in-vehicle device 100 and the server device 200 can be minimized.

In addition, in the battery state determination system 1, the diagnostic result of the deterioration state of the battery 40 diagnosed by the server device 200 can also be transmitted to the user terminal T. Accordingly, for example, the user of the user terminal T (the user U) such as a driver or the like of the vehicle 10 can identify the current deterioration state of the battery 40 at an arbitrary timing even when the driver is not in the vehicle 10. Further, a flow of processing between the server device 200 and the user terminal T is processing of transmission of identification requirement from the user terminal T to the server device 200 in a state in which the battery identification application is executed and transmission of the diagnostic result of the deterioration state of the battery 40 from the server device 200 to the user terminal T, which can be easily understood. For this reason, detailed description related to the flow of the processing between the server device 200 and the user terminal T will be omitted.

As described above, according to the battery state determination system of the embodiment, the in-vehicle device included in the vehicle 10 observes detected physical quantity of the battery for a plurality of different observation times, and transmits the feature data generated by calculating the feature related to a state change of the battery to the server device. Then, in the battery state determination system of the embodiment, the server device collects the feature data expressing the feature related to the state change of the battery transmitted from the in-vehicle device separately for each observation time, and diagnoses the deterioration state of the battery on the basis of the feature data group expressing the collected feature related to the state change of the battery. Accordingly, in the battery state determination system of the embodiment, it is possible to manage the deterioration state of the battery included in the vehicle while diagnosing the deterioration state of the battery in the server device more accurately. Moreover, in the battery state determination system of the embodiment, since the feature data, in a state in which the in-vehicle device has terminated the processing of obtaining the feature related to the state change of the battery to a certain extent, are transmitted to the server device, it is possible to diagnose and manage the deterioration state of the battery in a state in which a pressure in a communication band by the information (data) in the network NW between the in-vehicle device and the server device is minimized.

According to the battery state determination system of the above-mentioned embodiment, the in-vehicle device 100 includes the battery sensor 42 configured to acquire the physical quantity data showing the physical quantity related to the state of the battery 40 mounted in the vehicle 10, the controller 36 configured to observe the feature related to the state change of the battery 40 (for example, the I-V feature) on the basis of the physical quantity data for a plurality of different observation times, and the communication device 50 configured to transmit a plurality of pieces of feature data expressing the feature observed for each observation time to the server device 200, the server device 200 includes the communication part 202 configured to receive the plurality of pieces of feature data transmitted from the in-vehicle device 100, and the diagnosis part 204 configured to diagnose the deterioration state of the battery 40 on the basis of the plurality of pieces of feature data, and thus, determination of the deterioration state of the battery 40 mounted in the vehicle 10 can be performed more accurately in the server device 200. Accordingly, in the vehicle 10 in which the battery state determination system is employed, the deterioration state of the battery 40 included in the vehicle 10 can be managed more accurately in the server device 200, and it is possible to improve the convenience when the vehicle 10 is used, for example, informing in advance a user of a state in which a distance the vehicle 10 can travel is remarkably reduced and the like.

The above-mentioned embodiment can be expressed as follows.

A battery state determination system including an in-vehicle device and a server device,
wherein the in-vehicle device includes:
a hardware processor; and
a storage device on which a program is stored, and is configured to:
as the hardware processor read and executes the program stored in the storage device,
acquire physical quantity data showing a physical quantity related to a state of a battery mounted in a vehicle,
observe a feature related to a state change of the battery on the basis of the physical quantity data at a plurality of different observation times, and
transmit a plurality of pieces of feature data which expresses the feature observed for each observation time to the server device, and
the server device includes:
a hardware processor; and
a storage device on which a program is stored, and is configured to:
as the hardware processor reads and executes the program stored in the storage device, receive the plurality of pieces of feature data transmitted from the in-vehicle device, and diagnose a deterioration state of the battery on the basis of the plurality of pieces of feature data.

Further, in the embodiment, the case in which the vehicle 10 in which the battery state determination system is employed is the BEV has been described. However, the electric automobile is, for example, a hybrid electric automobile (HEV) or the like that travels using a motor (an electric motor) driven by electric power supplied according to an operation of an internal combustion engine such as an engine or the like operated by fuel or electric power supplied from a battery (a secondary battery) for traveling. For this reason, the battery state determination system may also be employed in such a hybrid electric automobile. In this case, in the hybrid electric automobile, even when the internal combustion engine is operated to charge the battery, it is the observation time of the object to observe the physical quantity data in order to diagnose the deterioration state of the battery. Also similarly in this case, diagnosis of the deterioration state of the battery mounted in the hybrid electric automobile can be performed more accurately in the server device. Further, a flow of the entire processing in the battery state determination system employed in the hybrid electric automobile can be easily understood as being similarly considered as the flow of the entire processing in the battery state determination system employed in the BEV according to the above-mentioned embodiment. For this reason, detailed description related to the flow of the entire processing in the battery state determination system employed in the hybrid electric automobile will be omitted.

In addition, for example, there is also an electrically driven vehicle that travels using an electric motor driven by electric power supplied from a fuel cell, for example, a fuel cell vehicle (FCV: a fuel cell automobile) or the like. The battery state determination system may also be employed in the fuel cell automobile. In this case, the battery described in the embodiment is replaced with the fuel cell. Even in the fuel cell, although the cause is different from that of the battery, deterioration occurs during the process of use. For this reason, the battery state determination system may also be employed in such a fuel cell automobile. However, processing of diagnosing the physical quantity observed in the in-vehicle device and the deterioration state in the server device corresponds to the fuel cell mounted in the fuel cell automobile. However, a flow of the entire processing in the battery state determination system employed in the fuel cell automobile can be easily understood as being similarly considered as the flow of the entire processing in the battery state determination system employed in the BEV according to the above-mentioned embodiment. For this reason, detailed description related to a flow of processing in the battery state determination system employed in the fuel cell automobile will be omitted.

While preferred embodiments of the invention have been described and illustrated above, it should be understood that these are exemplary of the invention and are not to be conceivable as limiting. Additions, omissions, substitutions, and other modifications can be made without departing from the scope of the present invention. Accordingly, the invention is not to be conceivable as being limited by the foregoing description, and is only limited by the scope of the appended claims.

What is claimed is:

1. A battery state determination system comprising:
an in-vehicle device; and
a server device, wherein the in-vehicle device comprises:
an acquisition part configured to acquire physical quantity data showing a current and a voltage of a battery mounted in a vehicle;
an observation part that is configured to observe a first physical quantity data output from the acquisition part in a first observation time, that is configured to observe a second physical quantity data output from the acquisition part in a second observation time which is an observation time longer than the first observation time, that is configured to generate a first feature data expressing a first state of the battery based on the first physical quantity data observed in the first observation time and that is configured to generate a second feature data expressing a second state of the battery based on the second physical quantity data observed in the second observation time; and
a transmission part configured to transmit the first feature data and the second feature data generated at the observation part, and wherein the server device comprises:
a reception part configured to receive the first feature data and the second feature data transmitted from the in-vehicle device; and
a diagnosis part configured to diagnose a deterioration state of the battery on the basis of the first feature data and the second feature data,
wherein the diagnosis part separately collects the first feature data and the second feature data for each of the first observation time and the second observation time, and diagnoses the deterioration state with reference to the first feature data, which is observed at a shorter observation time, among the collected first feature data and the second feature data, and
wherein the diagnosis part corrects a diagnostic result of the deterioration state using the second feature data for assistance.

2. The battery state determination system according to claim 1, wherein the first feature data and the second feature data comprise information showing a temperature of the battery during the observation time, and
the diagnosis part classifies the first feature data and the second feature data into a predetermined temperature range on the basis of the temperature included in the first feature data and the second feature data and diagnoses the deterioration state for each of the temperature range.

3. A battery state determination method in a battery state determination system comprising an in-vehicle device and a server device, which is performed by a computer of the in-vehicle device, the method comprising:
acquiring physical quantity data showing a current and a voltage of a battery mounted in a vehicle;
observing first physical quantity data output in a first observation time based on the acquiring;
observing second physical quantity data output in a second observation time based on the acquiring, wherein the second observation time is longer than the first observation time;
generating first feature data expressing a first state of the battery based on the first physical quantity data observed in the first observation time, and second feature data expressing a second state of the battery based on the second physical quantity data observed in the second observation time; and
transmitting the first feature data and the second feature data, wherein a second computer of the server device receives the first feature data and the second feature data transmitted from the in-vehicle device, and
diagnoses a deterioration state of the battery on the basis of the first feature data and the second feature data,
wherein the second computer of the server device separately collects the first feature data and the second feature data for each of the first observation time and the second observation time, and diagnoses the deterioration state with reference to the first feature data, which is observed at a shorter observation time, among the first feature data and the second feature data, and
wherein the second computer of the server device corrects a diagnostic result of the deterioration state using the second feature data for assistance.

* * * * *